(12) United States Patent
Eastty et al.

(10) Patent No.: US 6,604,009 B2
(45) Date of Patent: Aug. 5, 2003

(54) SIGNAL PROCESSORS

(75) Inventors: Peter Charles Eastty, Oxford (GB); Christopher Sleight, Chipping Norton (GB); Peter Damien Thorpe, Oxford (GB); James Andrew Scott Angus, York (GB)

(73) Assignees: Sony Corporation, Tokyo (JP); Sony United Kingdom Limited, Weybridge (GB)

( * ) Notice: Subject to any disclaimer, the term of this patent is extended or adjusted under 35 U.S.C. 154(b) by 0 days.

(21) Appl. No.: 10/052,592

(22) Filed: Jan. 18, 2002

(65) Prior Publication Data

US 2002/0159604 A1 Oct. 31, 2002

Related U.S. Application Data

(63) Continuation of application No. 09/187,655, filed on Nov. 6, 1998, which is a continuation of application No. 08/979,726, filed on Nov. 26, 1997, now abandoned.

(30) Foreign Application Priority Data

Nov. 27, 1996 (GB) .............................................. 9624673

(51) Int. Cl.⁷ .............................................. G06F 17/00
(52) U.S. Cl. ......................................... 700/94; 341/143
(58) Field of Search ................................. 381/104, 107, 381/106, 94.1, 94.2; 341/143, 144, 155, 126

(56) References Cited

U.S. PATENT DOCUMENTS

| | | | |
|---|---|---|---|
| 5,181,032 A | | 1/1993 | Ribner |
| 5,311,181 A | | 5/1994 | Ferguson, Jr. et al. |
| 6,175,322 B1 | * | 1/2001 | Eastty et al. ................. 341/143 |

OTHER PUBLICATIONS

Johns D A et al: "Design and Analysis of Delta–Sigma Based IIR Filters" IEEE Transactions on Circuits and Systems II: Analog and Digital Signal Processing, US, IEEE Inc. New York, vol. 40, No. 4, Apr. 1, 1993, pp. 233–240, XP000384958.

Adams R W et al: "Theory and Practical Implementation of a Fifth–Order Sigma–Delta A/D Converter" Journal of the Audio Engineering Society, US, Audio Engineering Society. New York, vol. 39, No. 7/08, Jul. 1, 1991, pp. 515–528, XP000227289.

Patent Abstracts of Japan, vol. 015, No. 108, Mar. 14, 1991 & JP 03 001723, Jan. 8, 1991.

* cited by examiner

*Primary Examiner*—Minson Oh Harvey
(74) *Attorney, Agent, or Firm*—Frommer Lawrence & Haug LLP; William S. Frommer

(57) ABSTRACT

A signal processor for 1-bit signals comprises a fifth order Delta-Sigma Modulator (DSM) having an input for receiving a 1-bit signal and an output at which a processed 1-bit signal is produced by a quantizer. The quantizer receives a p-bit signal from a series of five signal integration stages. Each stage comprises a first 1-bit multiplier coupled to the input, a second 1-bit multiplier coupled to the output, an adder which sums the outputs of the coefficient multipliers and an integrator which integrates the output of the adder. A final stage comprises a coefficient multiplier and an adder. The adder sums the output of the coefficient multiplier and the output of the integrator of the preceding integration stage. The coefficients are chosen to provide an overall attenuation of the input signal and of the quantization noise produced by the quantizer. Reduction of quantization noise allows several DSMs to be connected in series by preventing the build-up of excess noise, which may compromise stability.

5 Claims, 3 Drawing Sheets

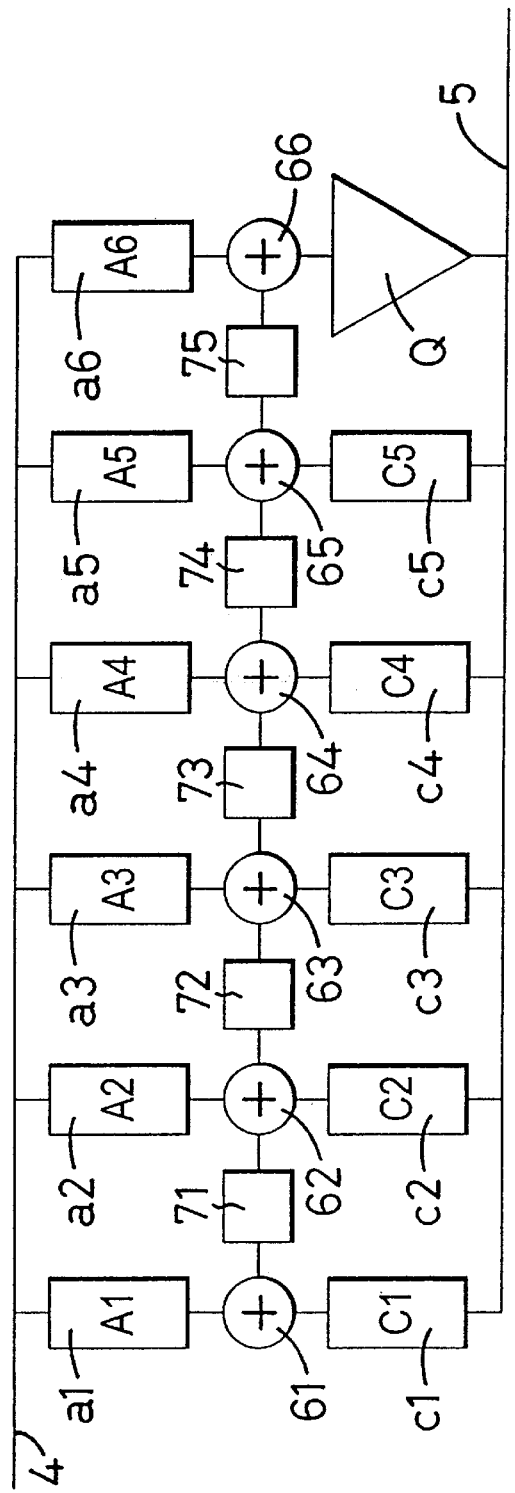
FIG. 4
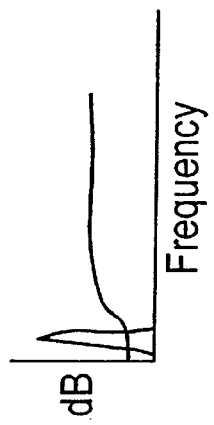
FIG. 5C
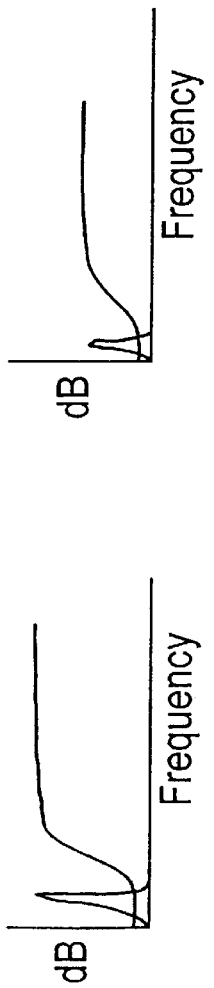
FIG. 5B
FIG. 5A

SIGNAL PROCESSORS

This application is a continuation of application Ser. No. 09/187,655, filed Nov. 6, 1998, which is a continuation of application Ser. No. 08/979,726, filed Nov. 26, 1997, now abandoned.

BACKGROUND OF THE INVENTION

1. Field of the Invention

The present invention relates to a 1-bit signal processor comprising an nth order Delta-Sigma Modulator having a filter section where n is at least three. Preferred embodiments of the invention relate to processing audio signals but the invention is not limited to audio signal processors.

2. Description of the Prior Art

Background to the present invention will now be described by way of example with reference to FIGS. 1, 2 and 3 of the accompanying drawings of which FIG. 1 is a block diagram of a known Delta-Sigma Modulator, FIG. 2 is a block diagram of a previously proposed Delta-Sigma Modulator configured as an 3rd order (n=3) filter section and FIG. 3 shows a noise shaping characteristic.

It is known to convert an analogue signal to a digital form by sampling the analogue signal at at least the Nyquist rate and encoding the amplitudes of the samples by an m bit number. Thus if m=8, the sample is said to be quantized to an accuracy of 8 bits. In general m can be any number of bits equal to or greater than 1.

For the purpose of quantizing to only 1 bit, it is known to provide an analogue to digital converter (ADC) known either as a "Sigma-Delta ADC" or as a "Delta-Sigma ADC". Herein the term "Delta-Sigma" is used. Such an ADC is described in for example "A Simple Approach to Digital Signal Processing" by Craig Marven and Gillian Ewers ISBN 0-904.047-00-8 published 1993 by Texas Instruments.

Referring to FIG. 1 in an example of such an ADC, the difference 1 (Delta) between an analogue input signal and the integral 2 (Sigma) of the 1-bit output signal is fed to a 1-bit quantizer 3. The output signal comprises bits of logical value 0 and 1 but representing actual values of −1 and +1 respectively. The integrator 3 accumulates the 1-bit outputs so that value stored in it tends to follow the value of the analog signal. The quantizer 3 increases (+1) or reduces (−1) the accumulated value by 1-bit as each bit is produced. The ADC requires a very high sampling rate to allow the production of an output bit stream the accumulated value of which follows the analogue signal.

The term "1-bit" signal as used in the following description and in the claims means a signal quantized to an accuracy of 1 digital bit such as is produced by a Delta-Sigma ADC.

A Delta-Sigma Modulator (DSM) configured as nth order filter section for directly processing a 1-bit signal was proposed by N. M. Casey and James A. S. Angus in a paper presented at the 95th AES Convention Oct. 7–10, 1993 New York, USA entitled "One Bit Digital Processing of Audio Signals"—Signal Processing: Audio Research Group, The Electronics Department, The University of York, Heslington, York YO1 5DD England. FIG. 2 shows a 3rd order (n=3) version of such a DSM filter section.

Referring to FIG. 2, the DSM has an input 4 for a 1-bit audio signal and an output 5 at which a processed a 1-bit signal is produced. The bits of the 1-bit signal are clocked through the DSM by known clocking arrangements which are not shown. The output 1-bit signal is produced by a 1-bit quantizer Q which is for example a comparator having a threshold level of zero. The DSM has three stages each comprising a first 1-bit multiplier $a_1$, $a_2$, $a_3$ connected to the input 4, a second 1-bit multiplier $c_1$, $c_2$, $c_3$ connected to the output 5, an adder $6_1$, $6_2$, $6_3$ and an integrator $7_1$, $7_2$, $7_3$.

The 1-bit multipliers multiply the received 1-bit signal by p bit coefficients $A_1$, $A_2$, $A_3$, $C_1$ $C_2$, $C_3$ producing p bit products which are added by the adders $6_1$, $6_2$, $6_3$ and the sums passed to the integrators 7. In the intermediate stages the adders $6_2$, $6_3$ also sum the output of the integrator of the preceding stage. A final stage comprises another 1-bit multiplier $A_4$ connected to the input which multiplies the input signal by a p bit coefficient $A_4$ and an adder $6_4$ which adds the product to the output of the integrator $7_3$ of the preceding stage. The sum is passed to the quantizer 2.

Within the DSM, two's complement arithmetic maybe used to represent the positive and negative p bit numbers. The input to the quantizer Q may be positive, quantized at the output as +1 (logical 1) or negative quantized at the output as −1 (logical 0).

As observed by Casey and Angus "a one bit processor . . . will produce a one bit output that contains an audio signal that is obscured by noise to an unacceptable level and it is imperative the quantization noise is suitably shaped". The noise which obscures the audio signal is the quantization noise produced by the quantizer Q.

The quantizer Q may be modelled as an adder which has a first input receiving an audio signal and a second input receiving a random bit stream (the quantization noise) substantially uncorrelated with the audio signal. Modelled on that basis, the audio signal received at the input 4 is fed forward by multipliers $a_1$, $a_2$, $a_3$, $a_4$ to the output 5 and fed back by multipliers $c_1$, $c_2$, $c_3$ from the output 5. Thus coefficients A1 to A4 in the feed forward path define zeros of the Z-transform transfer function of the audio signal and coefficients C1–C3 in the feed back path define poles of the transfer function of the audio signal.

The noise signal, however is fed-back from the quantizer by the multipliers $C_1$–$C_3$ so that coefficients C1–C3 define poles of the transfer function of the noise signal. The transfer function of the noise signal is not the same as that of the input signal.

The coefficients A1 to A4 and C1 to C3 are chosen to provide circuit stability amongst other desired properties.

The coefficients C1–C3 are chosen to provide noise shaping so as to minimise quantization noise in the audio band, as shown for example in FIG. 3 by the full line 31.

The coefficients A1–A4 and C1–C3 are also chosen for a desired audio signal processing characteristic.

The coefficients A1–A4 and C1–C3 may be chosen by:
 a) finding the Z-transform H(z) of the desired filter characteristic—e.g noise shaping function; and
 b) transforming H(z) to coefficients.

This may be done by the methods described in the papers
 "Theory and Practical Implementation of a Fifth Order Sigma-Delta A/D Converter, Journal of Audio Engineering Society, Volume 39, no. 7/8, 1991 July/August by R. W Adams et al."
and in the paper by Angus and Casey mentioned hereinbefore and using the knowledge of those skilled in the art. One way of calculating the coefficients is outlined in the accompanying Annex A.

It is proposed herein that a signal processor may comprise a plurality of DSMs coupled in series or cascaded, to process 1-bit signals. Such a proposal is not known from the papers mentioned above.

It is desirable to provide signal filtering between DSMs and also to maintain a 1-bit signal stream between DSMs. Such filtering may be needed for example to prevent undesired build-up of quantisation noise in successive DSMs. However, suitable digital filters would at least sum bits of the stream resulting in multi-bit numbers and/or multiply the bit stream by one or more p bit coefficients. All the coefficient multipliers of a DSM downstream of such a filter would then receive a p bit signal and would need to be p bit multipliers which are uneconomic.

SUMMARY OF THE INVENTION

According to one aspect of the present invention, there is provided a signal processor for 1-bit signals, comprising an nth order Delta-Sigma Modulator (DSM) where n is at least 3, the DSM having an input for receiving a 1-bit signal, a quantizer for requantizing a p-bit signal to 1-bit form the requantized signal being the output signal of the processor, a plurality of signal combiners including a first combiner for forming an integral of an additive combination of the product of the input signal and a coefficient and of the product of the output signal and a coefficient, at least two intermediate combiners each for forming an integral of an additive combination of the product of the input signal and a coefficient and of the product of the output signal and a coefficient, and of the integral of the preceding stage, and a final combiner for forming an additive combination of the product of the input signal and a coefficient and of the integral of the preceding stage to form the said p bit signal which is requantized by the quantizer to form the 1-bit output signal, wherein the said coefficients are chosen to provide an overall attenuation of the input signal and the quantization noise and to also provide a low pass filter which provides a compensating gain to the input signal.

By providing the overall attenuation and the compensating gain to the input signal, at least some noise outside the frequency band of the input signal (out of band noise) is reduced. It is believed that build up of noise whether within the band of the input signal (in-band noise) or out of band noise can at least reduce the stability of a DSM.

Some noise which exists in-band and adjacent the in-band frequency zone will be subject to the compensating gain because the low pass filter characteristic will have a "roll-off". However, overall noise is reduced.

By providing the overall attenuation and compensating gain in a DSM, 1-bit signals may be received, processed and fed to a subsequent DSM in 1-bit form avoiding the need for p bit coefficient multipliers in the signal combiners of the subsequent DSM.

BRIEF DESCRIPTION OF THE DRAWINGS

The above and other objects, features and advantages of the invention will be apparent from the following detailed description of illustrative embodiments which is to be read in connection with the accompanying drawings, in which:

FIG. 4 is a schematic block diagram of a Delta-Sigma Modulator according to the present invention;

FIG. 5 comprises frequency amplitude diagrams a, b and c illustrating the effect of the Delta-Sigma Modulator of FIG. 4 on an input signal;

DESCRIPTION OF THE PREFERRED EMBODIMENTS

Figure 1:
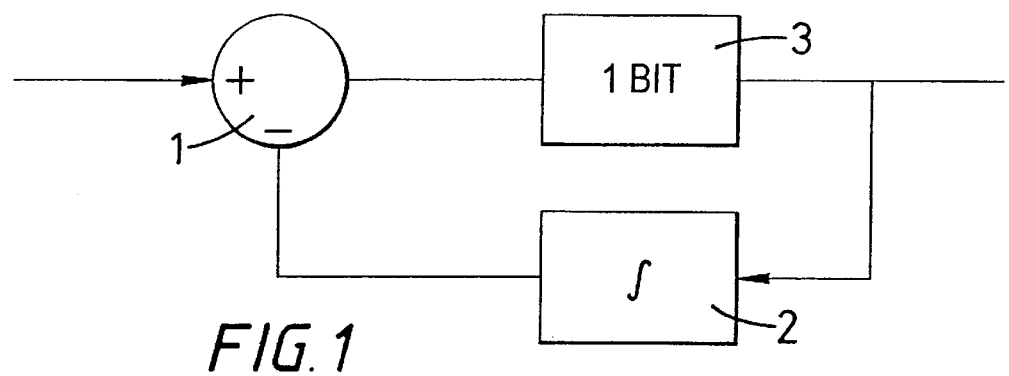
FIG. 1 is a block diagram of a known Delta-Sigma Modulator (DSM)
Figure 2:
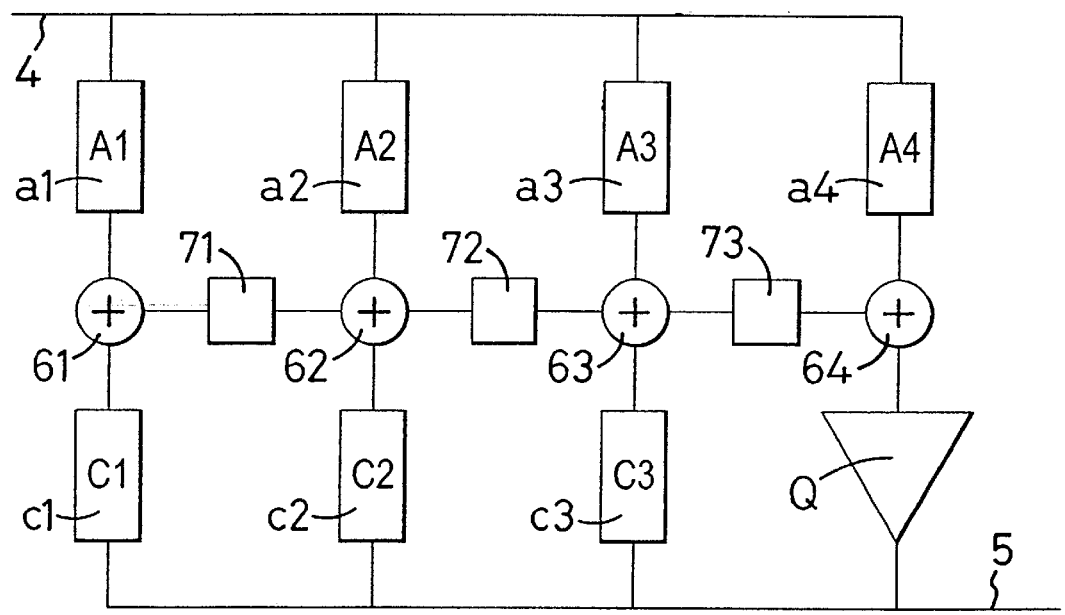
FIG. 2 is a block diagram of a previously proposed DSM.
Figure 3:
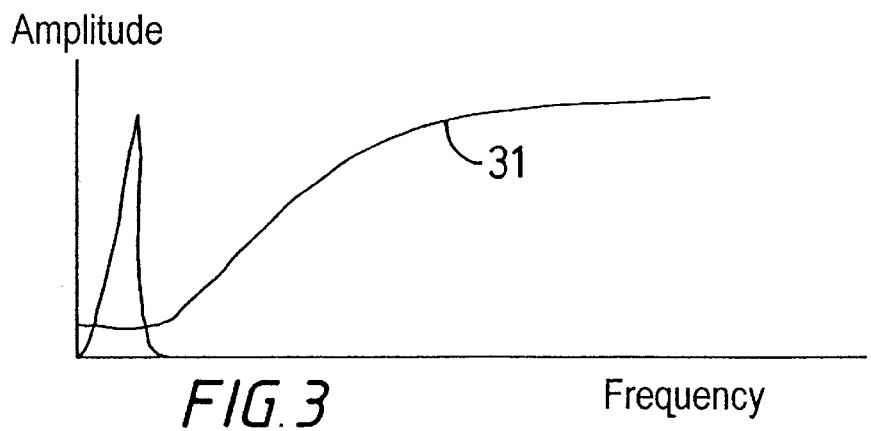
FIG. 3 shows a noise shaping characteristic.

The Delta-Sigma Modulator (DSM) of FIG. 4 is a fifth order DSM having five integrator sections and a final section. The DSM has an input 4 for receiving a 1-bit signal and an output 5 at which a processed 1-bit signal is produced. The bits are clocked through the DSM by known clocking arrangements (not shown).

The output signal is produced by a quantizer Q in the final stage. Quantizer Q receives a p bit signal which may be, for example, in twos complement form to represent positive and negative numbers. The quantizer maybe a comparator having a threshold of zero. The quantizer quantizes positive signals as +1 (logical 1) and quantizes negative signals as −1 (logic 0).

The first integrator section comprises a first 1-bit multiplier a1 connected to the input 4, a second 1-bit coefficient multiplier c1 connected to the output 5, an adder 61 which sums the outputs of the 1-bit multipliers a1 and c1 and an integrator 71 which integrates the output of the adder 61. The 1-bit coefficient multipliers multiply the 1-bit signals by p-bit coefficients A1 and C1.

Each of the four intermediate integrator sections likewise comprises a first 1-bit coefficient multiplier a2, a3, a4, a5, connected to the input 4, a second 1-bit coefficient multiplier c2, c3, c4, c5 connected to the output 5, an adder 62, 63, 64, 65 and an integrator 72, 73, 74, 75. The adders 62, 63, 64, 65 receive in addition to the outputs of the coefficients multipliers the output of the integrator of the preceding stage.

Figure 6:
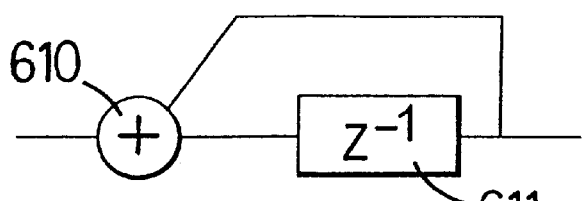
FIG. 6 is a block diagram of an integrator of the DSM of FIG. 4.

An example of an integrator 71, 72, 73, 4, 75 is shown in FIG. 6. The integrator comprises an adder 60 in series with a delay element 61. The output of the delay element is fed back to the adder to accumulate the integral of the output of the adder which sums the outputs of the coefficient multipliers. The adder 610 of FIG. 6 may be implemented by the adder 61–65 which sums the outputs of the coefficient multipliers of the stage. Thus it is not essential to have separate adders for the coefficient multipliers and for the integrator.

For the situation shown in FIG. 4 where the coefficients a1 to a5 and c1 to c5 are fixed and a separate adder is provided in the integrator, the coefficient multipliers a and c and the adder 6 which sums the outputs of the coefficient multipliers maybe replaced by a look-up table. For a 1-bit signal multiplied by a coefficient a1 and by a coefficient c1 the outputs are +a1, −a1, +c1, −c1. A look-up table can conveniently store all the possible combinations of +a1 and −a1 with +c1 and −c1; the store would be addressed by the 1-bit signals.

As discussed above the coefficients a1 to a6 and c1 to c5 may be chosen by the methods described in the above-mentioned papers.

The coefficients are, of course, chosen to provide circuit stability. Referring to FIG. 5a the coefficients are also chosen to provide noise shaping as indicated in solid line 51 in FIG. 5a whereby noise in the region of the input signal 52 (in-band noise) is reduced.

In accordance with an embodiment of the present invention as shown in FIGS. 4 and 5c the coefficients are further chosen so as to provide an overall attenuation by e.g. 6 dB of the input signal and the noise as shown in FIG. 5b and to provide in addition a low pass filter characteristic as indicated by dotted line 53 in FIG. 5c which compensates by e.g. 6 dB the attenuation of the input signal (and also any in-band noise) whilst retaining the attenuation of the out of band noise.

As shown in FIG. 5c the low pass filter characteristic 53 has a roll-off whereby the compensating gain is applied to at least some of the noise. FIGS. 5A to 5C are based on a design principle in which a 2nd order low pass filter is combined with a 3rd order DSM. In the results 5th order DSM, the results coefficients are distributed throughout the DSM.

Stability of a DSM is compromised by excessive noise whether in-band or out of band. The reduction of noise allows a plurality of DSMs to be cascaded in series as shown in FIG. 8 for example where 3 DSMs 70, 71, 72 are provided in series.

Figure 7:
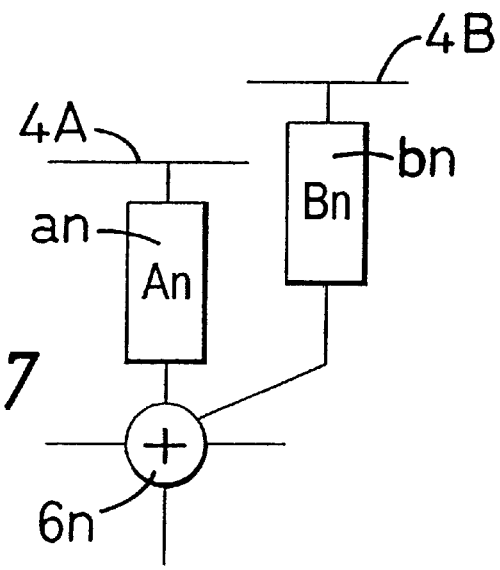
FIG. 7 is a schematic block diagram of modification of the DSM of FIG. 4.

Referring to FIG. 7 and as more fully described in co-filed UK application 9624671.5 Attorney reference I-96-24 (co-filed U.S. application Ser. No. 08/978,844, filed Nov. 26, 1997 incorporated herein by reference) a DSM maybe constructed as a signal mixer by providing 2 inputs 4a and 4b the input 4a being connected to the adder 61 to 66 by the coefficient multipliers a1 to a6 and the input 4b being connected to the same adders by further coefficient multipliers b. FIG. 7 shows the arrangement for just one integrator stage.

Figure 8:
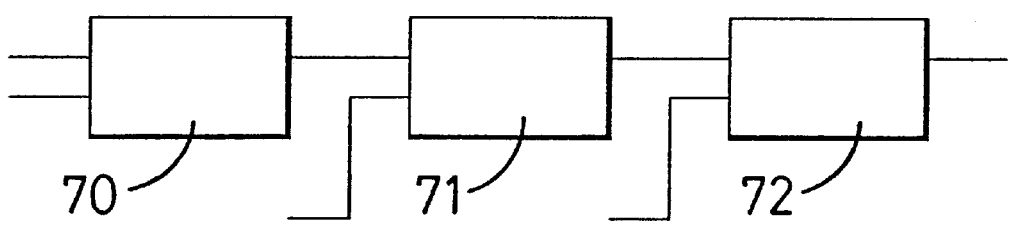
FIG. 8 is a schematic block diagram of a plurality of the DSMs of FIGS. 4, 5 and 6 in series.

Referring to FIG. 8 and as further explained in the co-filed UK application 9624671.5 Attorney reference I-96-24 P/1509.GB the DSMs 70, 71 and 72 may be signal mixers and adders.

Figure 9:
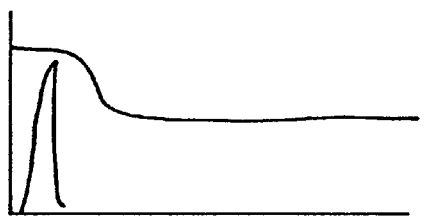
FIG. 9 is a frequency response diagram.

FIG. 9 shows an alternative filter characteristic in which a predetermined gain e.g. unity gain is applied to the audio band and lesser gain e.g. less than unity gain is applied outside the audio band. The coefficients of the 5th order DSM of FIG. 4 are chosen to implement the characteristic of FIG. 9.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

Calculating Coefficients

This annex outlines a procedure for analysing a fifth order DSM and for calculating coefficients of a desired filter characteristic.

A fifth order DSM is shown in Figure A having coefficients a to f and A to E, adders 6 and integrators 7. Integrators 7 each provide a unit delay. The outputs of the integrators are denoted from left to right s to w. The input to the DSM is a signal x[n] where [n] denotes a sample in a clocked sequence of samples. The input to the quantizer Q is denoted y[n] which is also the output signal of the DSM. The analysis is based on a model of operation which assumes quantizer Q is simply an adder which adds random noise to the processed signal. The quantizer is therefore ignored in this analysis.

The signal y[n]=fx[n]+w[n] i.e. output signal y[n] at sample [n] is the input signal x[n] multiplied by coefficient f plus the output w[n] of the preceding integrator 7.

Applying the same principles to each output signal of the integrators 7 results in Equations set 1.

$y[n]=fx[n]+w[n]$ $w[n]=w[n-1]+ex[n-1]+Ey[n-1]+v[n-1]$ $v[n]=v[n-1]+dx[n-1]+Dy[n-1]+u[n-1]$ $u[n]=u[n-1]+cx[n-1]+Cy[n-1]+t[n-1]$ $t[n]=t[n-1]+bx[n-1]+By[n-1]+s[n-1]$ $s[n]=s[n-1]+ax[n-1]+Ay[n-1]$

These equations are transformed into z-transform equations as well known in the art resulting in equations set 2.

$Y(z)=fX(z)+W(z)$ $W(z)(1-z^{-1})=z^{-1}(eX(z)+EY(z)+V(z))$ $V(z)(1-z^{-1})=z^{-1}(dX(z)+DY(z)+U(z))$ $U(z)(1-z^{-1})=z^{-1}(cX(z)+CY(z)+T(z))$ $T(Z)(1-z^{-1})=z^{-1}(bX(z)+BY(z)+S(z))$ $S(z)(1-z^{-1})=z^{-1}(aX(z)+AY(z))$

The z transform equations can be solved to derive Y(z) as a single function of X(z) (Equation 3)

$$Y(z) = fX(z) + \frac{z^{-1}}{(1-z^{-1})}\left(eX(z) + EY(z) + \frac{z^{-1}}{1-z^{-1}}\left(dX(z) + DY(z) + \frac{z^{-1}}{1-z^{-1}}\left(cX(z) + CY(z) + \frac{z^{-1}}{1-z^{-1}}\left(bX(z) + BY(z) + \frac{z^{-1}}{1-z^{-1}}(aX(z) + AY(z))\right)\right)\right)\right)$$

This may be reexpressed as shown in the right hand side of the following equation, Equation 4. A desired transfer function of the DSM can be expressed in series form $$\frac{Y(z)}{X(z)}$$

given in left hand side of the following equation and equated with the right hand side in Equation 4.

$$\frac{Y(z)}{X(z)} = \frac{\alpha_0 + \alpha_1 z^{-1} + \alpha_2 z^{-2} + \alpha_3 z^{-3} + \alpha_4 z^{-4} + \alpha_5 z^{-5}}{\beta_0 + \beta_1 z^{-1} + \beta_2 z^{-2} + \beta_3 z^{-3} + \beta_4 z^{-4} + \beta_5 z^{-5}}$$

$$= \frac{f(1-z^{-1})^5 + z^{-1}e(1-z^{-1})^4 + z^{-2}d(1-z^{-1})^3 + z^{-3}c(1-z^{-1})^2 + z^{-4}b(1-z^{-1}) + z^{-5}a}{(1-z^{-1})^5 - z^{-1}E(1-z^{-1})^4 - z^{-2}D(1-x^{-1})^3 - z^{-3}C(1-z^{-1})^2 - z^{-4}B(1-z^{-1}) - Z^{-5}A}$$

Equation 4 can be solved to derive the coefficients f to a from the coefficients $\alpha_0$ to $\alpha_5$ and coefficients E to A from the coefficients $\beta_0$ to $\beta_5$ as follows noting that the coefficients $\alpha_n$ and $\beta_n$ are chosen in known manner to provide a desired transfer function.

f is the only $z^0$ term in the numerator. Therefore $f=\alpha_0$.

The term $\alpha_0(1-z^{-1})^5$ is then subtracted from the left hand numerator resulting in $\alpha_0+\alpha_1 z^{-1}\ldots+\ldots\alpha_5 z^{-5}-\alpha_0(1-z^{-1})^5$ which is recalculated.

Similarly $f(1-z^{-1})^5$ is subtracted from the right hand numerator. Then e is the only $z^{-1}$ term and can be equated with the corresponding $\alpha_1$ in the recalculated left hand numerator.

The process is repeated for all the terms in the numerator.

The process is repeated for all the terms in the denominator.

We claim:

1. An audio signal processing system comprising a plurality of Delta-Sigma Modulators (DSM) arranged in series, at least one of the Delta-Sigma Modulators being an nth order Delta-Sigma Modulator where n is at least 3, the DSM having an input for receiving a 1-bit signal, a quantizer for requantizing a p-bit signal to 1-bit form, a requantized signal being an output signal of a processor, and a plurality of signal combiners including:

a first combiner for forming an integral of an additive combination of a product of the input signal and a coefficient and of a product of the output signal and a coefficient, at least two intermediate combiners each for forming an integral of an additive combination of a product of the input signal and a coefficient and of a product of the output signal and a coefficient, and of an integral of a preceding stage, and a final combiner for forming an additive combination of a product of the input signal and a coefficient and of the integral of the preceding stage to form the p bit signal which is requantized by the quantizer, to form the 1-bit output signal, wherein the coefficients are chosen to provide an overall attenuation of the input signal and a quantization noise, and also to provide a low pass filter which provides a gain to the input signal which compensates for the attenuation; and wherein said coefficients are fixed and a separate adder is provided in an integrator to enable sums of outputs of coefficient multipliers to be replaced by a look-up table, whereby said look-up table stores all combinations of said coefficient multipliers addressed by said 1-bit signals.

2. A processor according to claim 1, wherein the predetermined gain is unity.

3. A processor according to claim 1, wherein the attenuation is 6 dB and the gain is 6 dB.

4. A processor according to claim 1, wherein n=5, there being four intermediate combiners.

5. A processor according to claim 1, wherein the DSM has a further input for receiving a further 1-bit signal and each combiner additionally combines the product of the further 1-bit signal with a further coefficient with the aforesaid additive combination.

* * * * *